US009091725B2

(12) United States Patent
Jeong et al.

(10) Patent No.: US 9,091,725 B2
(45) Date of Patent: Jul. 28, 2015

(54) BOARD INSPECTION APPARATUS AND METHOD

(75) Inventors: Joong-Ki Jeong, Seoul (KR); Yu-Jin Lee, Seoul (KR); Seung-Jun Lee, Seoul (KR); Bong-Ha Hwang, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 914 days.

(21) Appl. No.: 12/829,996

(22) Filed: Jul. 2, 2010

(65) Prior Publication Data

US 2011/0002527 A1    Jan. 6, 2011

(30) Foreign Application Priority Data

Jul. 3, 2009 (KR) .................. 10-2009-0060552
Feb. 1, 2010 (KR) .................. 10-2010-0008911

(51) Int. Cl.
*G01B 11/24* (2006.01)
*G01R 31/309* (2006.01)
*G01B 11/25* (2006.01)
*G06T 7/00* (2006.01)
*G06K 9/00* (2006.01)
*G06K 9/46* (2006.01)
*G01R 31/00* (2006.01)

(52) U.S. Cl.
CPC .......... *G01R 31/309* (2013.01); *G01B 11/2531* (2013.01); *G06T 7/0057* (2013.01)

(58) Field of Classification Search
CPC ............... G01B 11/2531; G01B 11/28; G01B 9/02058; G01B 31/309; G02B 21/367; G06K 2209/40; G06K 9/00067; G06K 9/00973; G06K 9/2009; G06K 9/56; G09G 2340/0407
See application file for complete search history.

(56) References Cited

U.S. PATENT DOCUMENTS

| | | | | |
|---|---|---|---|---|
| 5,757,193 A * | 5/1998 | Yu et al. | ......................... | 324/501 |
| 6,278,797 B1 * | 8/2001 | Nagasaki et al. | .............. | 382/146 |
| 6,424,735 B1 * | 7/2002 | Freifeld | .......................... | 382/154 |
| 6,611,614 B1 * | 8/2003 | Jung et al. | ...................... | 382/125 |
| 6,710,607 B2 * | 3/2004 | Fujii et al. | ................ | 324/754.03 |
| 6,807,308 B2 * | 10/2004 | Chui et al. | ..................... | 382/240 |
| 6,958,619 B2 * | 10/2005 | Yamaoka et al. | ......... | 324/754.28 |
| 2003/0039388 A1 * | 2/2003 | Ulrich et al. | ................... | 382/145 |
| 2005/0254066 A1 * | 11/2005 | Mamiya et al. | ................ | 356/604 |
| 2007/0090189 A1 * | 4/2007 | Suwa et al. | .................... | 235/454 |
| 2007/0177159 A1 * | 8/2007 | Kim et al. | ...................... | 356/601 |
| 2008/0049234 A1 * | 2/2008 | Seitz | .............................. | 356/521 |
| 2008/0204764 A1 * | 8/2008 | Kimura | ........................... | 356/601 |

FOREIGN PATENT DOCUMENTS

| | | |
|---|---|---|
| JP | 02-165004 | 6/1990 |
| JP | 04-099951 | 3/1992 |
| JP | 09-321500 | 12/1997 |

(Continued)

*Primary Examiner* — Ryan Zeender
*Assistant Examiner* — Dana Amsdell
(74) *Attorney, Agent, or Firm* — Kile Park Reed & Houtteman PLLC

(57) ABSTRACT

An inspection method includes photographing a measurement target to acquire image data for each pixel of the measurement target, acquiring height data for each pixel of the measurement target, acquiring visibility data for each pixel of the measurement target, multiplying the acquired image data by at least one of the height data and the visibility data for each pixel to produce a result value, and setting a terminal area by using the produced result value. Thus, the terminal area may be accurately determined.

8 Claims, 9 Drawing Sheets

(56) References Cited

FOREIGN PATENT DOCUMENTS

| JP | 2003-279334 | 10/2003 |
| JP | 2004-340832 | 12/2004 |
| JP | 2005-318851 | 11/2005 |
| JP | 2006-220427 A | 8/2006 |
| JP | 2007-199070 | 8/2007 |
| JP | 2009-053209 | 3/2009 |
| KR | 100672818 B1 | 1/2007 |
| KR | 10-2008-0027757 A | 3/2008 |
| KR | 1020090092116 A | 8/2009 |

* cited by examiner

BOARD INSPECTION APPARATUS AND METHOD

CROSS REFERENCE TO RELATED APPLICATION

This application claims priority from and the benefit of Korean Patent Applications No. 2009-60552 filed on Jul. 3, 2009, and No. 2010-8911 filed on Feb. 1, 2010, which are hereby incorporated by reference for all purposes as if fully set forth herein.

BACKGROUND OF THE INVENTION

1. Field of the Invention

Exemplary embodiments of the present invention relate to a board inspection apparatus and a board inspection method. More particularly, exemplary embodiments of the present invention relate to a board inspection apparatus and a board inspection method capable of clearly discriminating a terminal and a solder from each other in mounting a component on a printed circuit board.

2. Discussion of the Background

Generally, a three dimensional shape measurement apparatus illuminates a grating pattern light onto a measurement target and photographs a reflection image by the grating pattern light to measure a three dimensional shape of the measurement target. The three dimensional shape measurement apparatus typically includes a stage, a camera, an illumination unit, a central processing section, etc.

Generally, a mounting board in which a semiconductor component is mounted on a printed circuit board is employed in various electronic products. In manufacturing the mounting board, terminals of the semiconductor component are soldered on a pad on the printed circuit board.

It is required to inspect whether the mounted semiconductor component is soldered on the printed circuit board well or not. In inspecting the mounting board, it is important that a terminal area and a solder area are discriminated from each other to increase accuracy of inspecting the semiconductor component.

Conventionally, a two dimensional image acquired by using two dimensional illuminator has been used to discriminate the areas. However, since colors of the areas are similar and sensitive to the illuminator, it is difficult to easily discriminate the terminal area and the solder area from each other by using the two dimensional image, and noise of a camera may have a great effect so that the areas are not clearly discriminated.

In addition, in order to clearly discriminate a boundary portion between the terminal area and the solder area by using the two dimensional image, it is required to increase contrast. However, in the conventional mounting board inspection apparatus, there is a limit to increasing contrast obtained by the two dimensional illuminator, and thus it is difficult that the terminal area and the solder area of the semiconductor component are clearly discriminated from each other.

SUMMARY OF THE INVENTION

Exemplary embodiments of the present invention provide a board inspection apparatus capable of enhancing reliability by clearly discriminating a terminal area and a solder area from each other.

Exemplary embodiments of the present invention also provide a board inspection method capable of clearly discriminating a terminal area and a solder area from each other.

Exemplary embodiments of the present invention also provide a board inspection method of inspecting a board by using the board inspection apparatus.

Additional features of the invention will be set forth in the description which follows, and in part will be apparent from the description, or may be learned by practice of the invention.

An exemplary embodiment of the present invention discloses an inspection method. The inspection method includes photographing a measurement target to acquire image data for each pixel of the measurement target, acquiring height data for each pixel of the measurement target, acquiring visibility data for each pixel of the measurement target, multiplying the acquired image data by at least one of the height data and the visibility data for each pixel to produce a result value, and setting a terminal area by using the produced result value.

The result value may be produced by multiplying the image data, the height data and the visibility data for each pixel. The visibility data may be a ratio of amplitude ($Bi(x,y)$) to average ($Ai(x,y)$) (or ($Vi(x,y)=Bi(x,y)/Ai(x,y)$)) in intensity of a photographed image for each pixel.

Acquiring the height data and the visibility data for each pixel of the measurement target, may include projecting a grating pattern light onto the measurement target by N times, acquiring reflection image data by the grating pattern light projected onto the measurement target by N times, acquiring the height data by using the acquired N reflection image data, and acquiring the visibility data by using the reflection image data.

After acquiring the reflection image data by the grating pattern light projected onto the measurement target by N times, the inspection method may further include averaging the N reflection image data to acquire the image data.

The measurement target may be photographed in a plurality of directions, and image data for each pixel, the height data for each pixel and the visibility data for each pixel of the measurement target may be acquired for the plurality of directions. Multiplying the acquired image data by at least one of the height data and the visibility data for each pixel to produce the result value may includes selecting maximum image data from the image data for the plurality of directions, for each pixel, selecting maximum height data from the height data for the plurality of directions, for each pixel, selecting maximum visibility data from the visibility data for the plurality of directions, for each pixel, and multiplying the maximum image data, the maximum height data and the maximum visibility data, which are selected for each pixel, to produce the result value. Multiplying the acquired image data by at least one of the height data and the visibility data for each pixel to produce the result value may further include checking whether the maximum image data, the maximum height data and the maximum visibility data are greater than a predetermined reference value or not.

Another exemplary embodiment of the present invention discloses an inspection method. The inspection method includes illuminating a grating pattern light onto a measurement target by N times for each of a plurality of M directions to acquire M×N image data, M height data and M visibility data for each pixel of the measurement target, wherein N and M are natural numbers greater than or equal to two, averaging the N image data among the M×N image data for each of the M directions, to produce M average image data corresponding to the M directions for each pixel, selecting average maximum image data from the M average image data, for each pixel, selecting maximum height data from the M height data, for each pixel, selecting maximum visibility data from the M visibility data, for each pixel, multiplying the average maximum image data, the maximum height data and the maximum visibility data for each pixel, which are selected for each pixel, to produce a result value, and discriminating a terminal area by using the produced result value.

Discriminating the terminal area by using the produced result value may include classifying the result value produced for each pixel into at least two groups so that pixels belong to a same group are continuously distributed and discriminating the terminal area from a solder area by using the classified group.

Still another exemplary embodiment of the present invention discloses a board inspection apparatus. The board inspection apparatus includes a stage transferring a board, a first illumination section illuminating a light for aligning the board onto an inspection target, a projecting section projecting a grating pattern light for acquiring height data of the board onto the inspection target, a second illumination section illuminating a light for setting a terminal area of a component mounted on the board onto the inspection target, a third illumination section located nearer to the board than the second illumination section, an image photographing section photographing a first image of the board by light illumination of the second illumination section and photographing a second image of the board by grating pattern light illumination of the projecting section, and a control section discriminating the terminal area by using the first image and the second image photographed by the image photographing section.

The second illumination section may be installed between the image photographing section and the projecting sections. The second illumination section may illuminate the light at an angle ranging from about 17° to about 20° with respect to a normal line perpendicular to a flat plane of the board.

The control section may generate a contrast map by using at least one of visibility data and height data acquired from the second image and image data acquired from the first image, and the terminal area may be discriminated by analyzing the contrast map.

The projecting section may project the grating pattern light onto the board by N times, and the image photographing section photographs an image by using the grating pattern light projected onto the board by N times. The visibility data may be a ratio of amplitude ($Bi(x,y)$) to average ($Ai(x,y)$) (or ($Vi(x,y)=Bi(x,y)/Ai(x,y)$)) in intensity of the image photographed by the image photographing section. The projecting section may be plural to project grating pattern lights in different directions onto the board, and the control section may acquire a plurality of height data and a plurality of visibility data by the plurality of projecting sections. The control section may multiply a maximum value of the plurality of height data, a maximum value of the plurality of visibility data and second image data to generate the contrast map.

Still another exemplary embodiment of the present invention discloses a board inspection method. The board inspection method includes transferring a board to a measurement location by transferring a stage, illuminating a first light onto the board to align the board, illuminating a second light from between an image photographing section and a projecting section onto the board to photograph a first image of the board, illuminating a grating pattern light of the projecting section onto the board by N times to photograph a second image of the board, acquiring visibility data and height data from the second image, generating a contrast map by using the first image, the visibility data and the height data, and discriminating a terminal area of a component mounted on the board by using the contrast map.

According to the present invention, image data, height data and visibility data of a measurement target are acquired and multiplied to produce a result value, and a terminal area and a solder area are discriminated from each other by using the result value, to thereby more accurately determine the terminal area and more precisely inspect a terminal.

In addition, since the terminal area is determined by using three dimensional data based on height, it is not much affected by color of each area and not sensitive to light, in comparison with determining the terminal area by using two dimensional image. Thus, each area may be more accurately and easily discriminated, and noise of a camera may not have a great effect.

In addition, when the image data are acquired by using three dimensional data, the terminal area may be easily determined without acquiring two dimensional image data.

In addition, independently of a first illumination section installed adjacent to an image photographing section, a second illumination section of a ring form is additionally installed between the image photographing section and projecting sections to enhance brightness uniformity in a field of view, and illumination angle of the second illumination section is set to be smaller than that of a projecting section to enhance contrast of a photographed image. Thus, an image obtained using the projecting section and an image obtained using the second illumination section are combined to clearly discriminate the terminal area and the solder area from each other, which are formed on the inspection target, and enhance inspection reliability.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
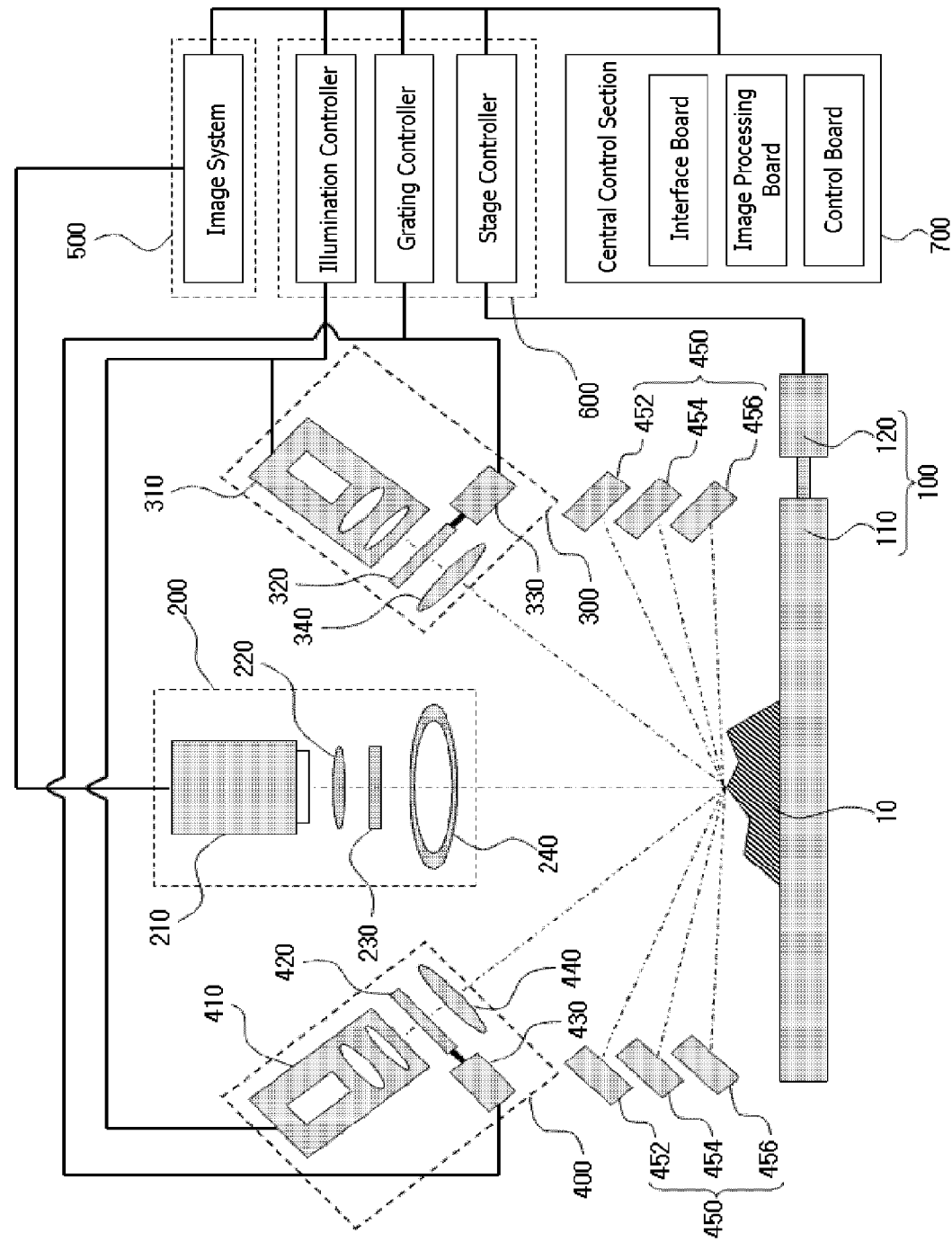
FIG. 1 is a schematic view illustrating a three dimensional shape measurement apparatus used to a method of measuring a three dimensional shape according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

FIG. 1 is a schematic view illustrating a three dimensional shape measurement apparatus used to a method of measuring a three dimensional shape according to an exemplary embodiment of the present invention.

Referring to FIG. 1, a three dimensional shape measurement apparatus used to a method of measuring a three dimensional shape according to an exemplary embodiment of the present invention may include a measurement stage section 100, an image photographing section 200, a first illumination unit including first and second projecting sections 300 and 400, a second illumination unit 450, an image acquiring section 500, a module control section 600 and a central control section 700.

The measurement stage section 100 may include a stage 110 supporting a measurement target 10 and a stage transfer unit 120 transferring the stage 110. In an exemplary embodiment, according as the measurement target 10 moves with respect to the image photographing section 200 and the first and second projecting sections 300 and 400 by the stage 110, a measurement location may be changed in the measurement target 10.

The image photographing section 200 is disposed over the stage 110 to receive light reflected by the measurement target 10 and measure an image of the measurement target 10. That is, the image photographing section 200 receives the light that exits the first and second projecting sections 300 and 400 and is reflected by the measurement target 10, and photographs a plan image of the measurement target 10.

The image photographing section 200 may include a camera 210, an imaging lens 220, a filter 230 and a lamp 240. The camera 210 receives the light reflected by the measurement target 10 and photographs the plan image of the measurement target 10. The camera 210 may include, for example, one of a CCD camera and a CMOS camera. The imaging lens 220 is disposed under the camera 210 to image the light reflected by the measurement target 10 on the camera 210. The filter 230 is disposed under the imaging lens 220 to filter the light reflected by the measurement target 10 and provide the filtered light to the imaging lens 220. The filter 230 may include, for example, one of a frequency filter, a color filter and a light intensity control filter. The lamp 240 may be disposed under the filter 230 in a circular shape to provide the light to the measurement target 10, so as to photograph a particular image such as a two-dimensional shape of the measurement target 10.

The first projecting section 300 may be disposed, for example, at a right side of the image photographing section 200 to be inclined with respect to the stage 110 supporting the measurement target 10. The first projecting section 300 may include a first light source unit 310, a first grating unit 320, a first grating transfer unit 330 and a first condensing lens 340. The first light source unit 310 may include a light source and at least one lens to generate light, and the first grating unit 320 is disposed under the first light source unit 310 to change the light generated by the first light source unit 310 into a first grating pattern light having a grating pattern. The first grating transfer unit 330 is connected to the first grating unit 320 to transfer the first grating unit 320, and may include, for example, one of a piezoelectric transfer unit and a fine linear transfer unit. The first condensing lens 340 is disposed under the first grating unit 320 to condense the first grating pattern light exiting the first grating unit 320 on the measurement target 10.

For example, the second projecting section 400 may be disposed at a left side of the image photographing section 200 to be inclined with respect to the stage 110 supporting the measurement target 10. The second projecting section 400 may include a second light source unit 410, a second grating unit 420, a second grating transfer unit 430 and a second condensing lens 440. The second projecting section 400 is substantially the same as the first projecting section 300 described above, and thus any further description will be omitted.

When the first grating transfer unit 330 sequentially moves the first grating unit 320 by N times and N first grating pattern lights are illuminated onto the measurement target 10 in the first projecting section 300, the image photographing section 200 may sequentially receive the N first grating pattern lights reflected by the measurement target 10 and photograph N first pattern images. In addition, when the second grating transfer unit 430 sequentially moves the second grating unit 420 by N times and N second grating pattern lights are illuminated onto the measurement target 10 in the second projecting section 400, the image photographing section 200 may sequentially receive the N second grating pattern lights reflected by the measurement target 10 and photograph N second pattern images. The 'N' is a natural number, and for example may be four.

In an exemplary embodiment, the first and second projecting sections 300 and 400 are described as an illumination apparatus generating the first and second grating pattern lights. Alternatively, the projecting section may be more than or equal to three. In other words, the grating pattern light may be illuminated onto the measurement target 10 in various directions, and various pattern images may be photographed. For example, when three projecting sections are disposed in an equilateral triangle form with the image photographing section 200 being the center of the equilateral triangle form, three grating pattern lights may be illuminated onto the measurement target 10 in different directions. For example, when four projecting sections are disposed in a square form with the image photographing section 200 being the center of the square form, four grating pattern lights may be illuminated onto the measurement target 10 in different directions. In addition, the first illumination unit may include eight projecting sections, and grating pattern lights may be illuminated onto the measurement target 10 in eight directions to photograph an image.

The second illumination unit 450 illuminates light for acquiring a two dimensional image of the measurement target 10 onto the measurement target 10. In an exemplary embodiment, the second illumination unit 450 may include a red illumination 452, a green illumination 454, and a blue illumination 456. For example, the red illumination 452, the green illumination 454, and the blue illumination 456 may be disposed in a circular shape over the measurement target 10 to illuminate a red light, a green light and a blue light, respectively, and may be disposed at different heights as shown in FIG. 1.

The image acquiring section 500 is electrically connected to the camera 210 of the image photographing section 200 to acquire the pattern images according to the first illumination unit from the camera 210 and store the acquired pattern images. In addition, the image acquiring section 500 acquires the two dimensional images according to the second illumination unit from the camera 210 and store the acquired two dimensional images. For example, the image acquiring section 500 may include an image system that receives the N first pattern images and the N second pattern images photographed in the camera 210 and stores the images.

The module control section 600 is electrically connected to the measurement stage section 100, the image photographing section 200, the first projecting section 300 and the second projecting section 400, to control the measurement stage section 100, the image photographing section 200, the first projecting section 300 and the second projecting section 400. The module control section 600 may include, for example, an illumination controller, a grating controller and a stage controller. The illumination controller controls the first and second light source units 310 and 410 to generate light, and the grating controller controls the first and second grating transfer units 330 and 430 to move the first and second grating units 320 and 420. The stage controller controls the stage transfer unit 120 to move the stage 110 in an up-and-down motion and a left-and-right motion.

The central control section 700 is electrically connected to the image acquiring section 500 and the module control section 600 to control the image acquiring section 500 and the module control section 600. Particularly, the central control section 700 receives the N first pattern images and the N second pattern images from the image system of the image acquiring section 500 to process the images, so that three dimensional shape of the measurement target may be measured. In addition, the central control section 700 may control an illumination controller, a grating controller and a stage controller of the module control section 600. Thus, the central control section may include an image processing board, a control board and an interface board.

Hereinafter, a method of inspecting a predetermined element mounted on a printed circuit board, which is employed as the measurement target 10, by using the above described three dimensional shape measurement apparatus will be described in detail.

Figure 2:
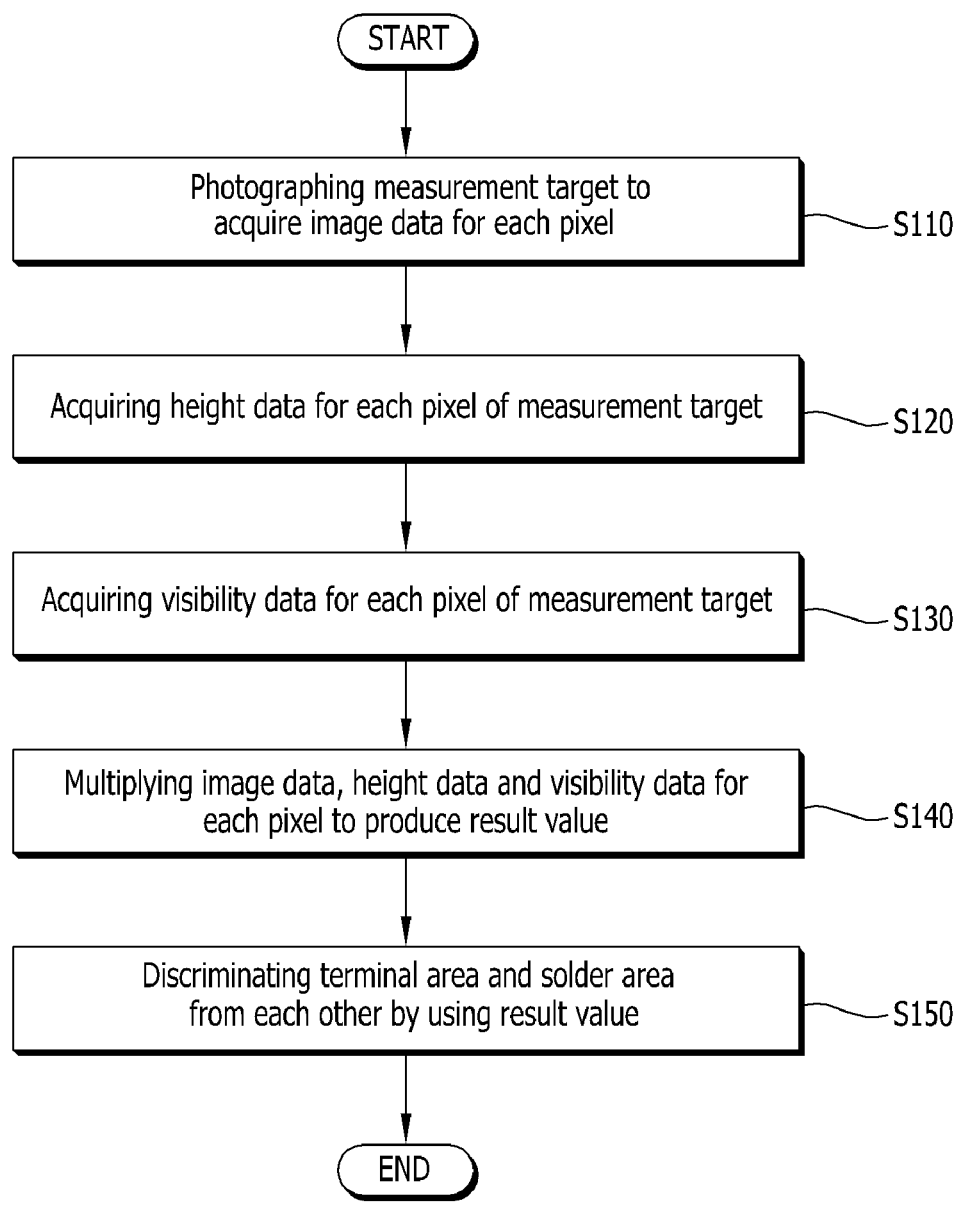
FIG. 2 is a flow chart illustrating a terminal inspection method according to an exemplary embodiment of the present invention.
Figure 3:
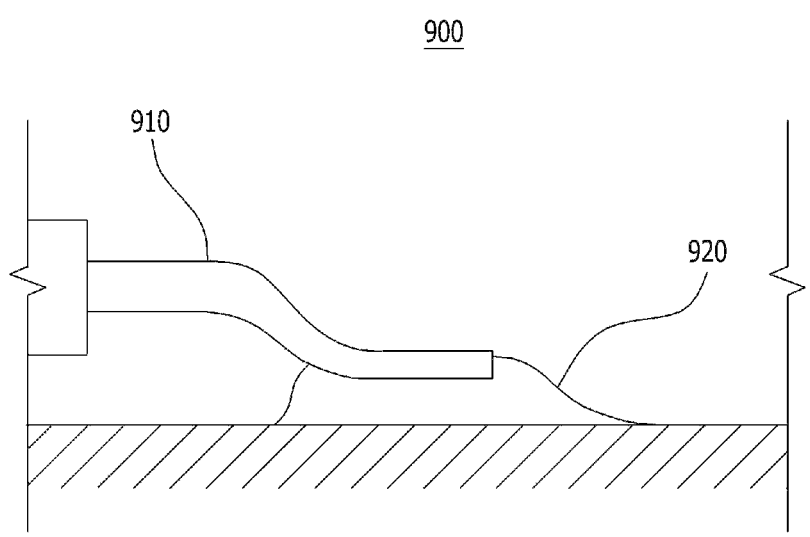
FIG. 3 is a schematic view illustrating an example of a terminal and a solder formed on a printed circuit board.

FIG. 2 is a flow chart illustrating a terminal inspection method according to an exemplary embodiment of the present invention. FIG. 3 is a schematic view illustrating an example of a terminal and a solder formed on a printed circuit board.

Referring to FIGS. 2 and 3, in order to inspect a terminal according to an exemplary embodiment of the present invention, firstly, a measurement target is photographed for each pixel of the measurement target to acquire image data in step S110.

The measurement target corresponds to a terminal 910 and a solder 920 formed on a printed circuit board 900.

The image data for each pixel of the measurement target may be acquired by measuring a two dimensional image. For example, the measurement target may be photographed by using the lamp 240 for measuring a two dimensional image or the second illumination unit 450 of the three dimensional measurement apparatus illustrated in FIG. 1.

Alternatively, the image data for each pixel may be acquired by using image data obtained for measuring a three dimensional shape. For example, photographing the measurement target may be performed by photographing a three dimensional image using the first illumination unit of the three dimensional measurement apparatus illustrated in FIG. 1. As described above, the first illumination unit may include the first and second projecting sections 300 and 400 or more projecting sections. Particularly, firstly, grating pattern lights are projected in a plurality of directions onto the measurement target by using the projecting sections, and then reflection images of the grating pattern lights projected onto the measurement target are photographed to acquire three dimensional image data. The image data may be acquired by averaging the three dimensional image data.

For example, grating pattern lights may be respectively projected onto the measurement target by N times for each of a plurality of M directions, to acquire M×N image data for each pixel of the measurement target. The 'N' and the 'M' are natural numbers greater than or equal to two. The N image data among the M×N image data are averaged for each of the M directions, to produce M average image data corresponding to the M directions for each pixel.

Then, height data is acquired for each pixel of the measurement target in step S120.

The height data for each pixel may be acquired by using the image data obtained for measuring a three dimensional shape. For example, the height data may be acquired by photographing a three dimensional image using the first illumination unit of the three dimensional measurement apparatus illustrated in FIG. 1, as described above. In an exemplary embodiment, the height data may be acquired by converting the three dimensional image data by using a bucket algorithm.

For example, the grating pattern lights are projected onto the measurement target by N times for each of the M directions, to acquire M height data for each pixel of the measurement target.

Thereafter, visibility data is acquired for each pixel of the measurement target in step S130.

The visibility is a ratio of amplitude Bi(x,y) to average Ai(x,y) in intensity. In general, the visibility increases as reflectivity increases. The visibility Vi(x,y) may be expressed as follows, $$Vi(x,y) = Bi(x,y)/Ai(x,y).$$

The grating pattern lights may be projected onto the printed circuit board in various directions to acquire various kinds of pattern images. As shown in FIG. 1, the image acquiring section 500 extracts N intensity signals $I^i_1, I^i_2, \ldots, I^i_N$ at each position i(x,y) in an X-Y coordinate system from N pattern images captured by the camera 210, and average Ai(x,y) and visibility Vi(x,y) are produced by using an N-bucket algorithm.

For example, the visibility may be produced as follows in case that N=3 and N=4, respectively.

In case that N=3, visibility Vi(x,y) is produced as follows.

$$A_i(x, y) = \frac{I^i_1 + I^i_2 + I^i_3}{3}$$

$$V_i(x, y) = \frac{B_i}{A_i} = \frac{\sqrt{(2I^i_1 - I^i_2 - I^i_3)^2 + 3(I^i_2 - I^i_3)^2}}{(I^i_1 + I^i_2 + I^i_3)}$$

In case that N=4, visibility Vi(x,y) is produced as follows.

$$A_i(x, y) = \frac{I^i_1 + I^i_2 + I^i_3 + I^i_4}{4}$$

$$V_i(x, y) = \frac{B_i}{A_i} = \frac{2\sqrt{(I^i_1 - I^i_3)^2 + (I^i_2 - I^i_4)^2}}{(I^i_1 + I^i_2 + I^i_3 + I^i_4)}$$

The visibility information may be acquired by projecting grating pattern lights onto the measurement target in at least two directions, likewise a step of acquiring height information by pixels of the measurement target (step S120). That is, the visibility information by pixels may be easily acquired also from data of the target obtained by using, for example, the apparatus for measuring a three-dimensional shape in FIG. 1.

The visibility data for each pixel may be acquired by using the image data obtained for measuring a three dimensional shape. For example, the visibility data may be acquired by photographing a three dimensional image using the first illumination unit of the three dimensional measurement apparatus illustrated in FIG. 1, as described above. In an exemplary embodiment, the visibility data may be acquired by converting the three dimensional image data by using a visibility calculation algorithm.

For example, the grating pattern lights are projected onto the measurement target by N times for each of the M directions, to acquire M visibility data for each pixel of the measurement target.

Then, the image data, the height data and the visibility data acquired for each pixel are multiplied for each pixel to produce a result value in step S140.

Since the image data, the height data and the visibility data acquired for each pixel may be plural data measured in the plurality of directions, the plural data may be properly used to produce the result value.

Figure 4:
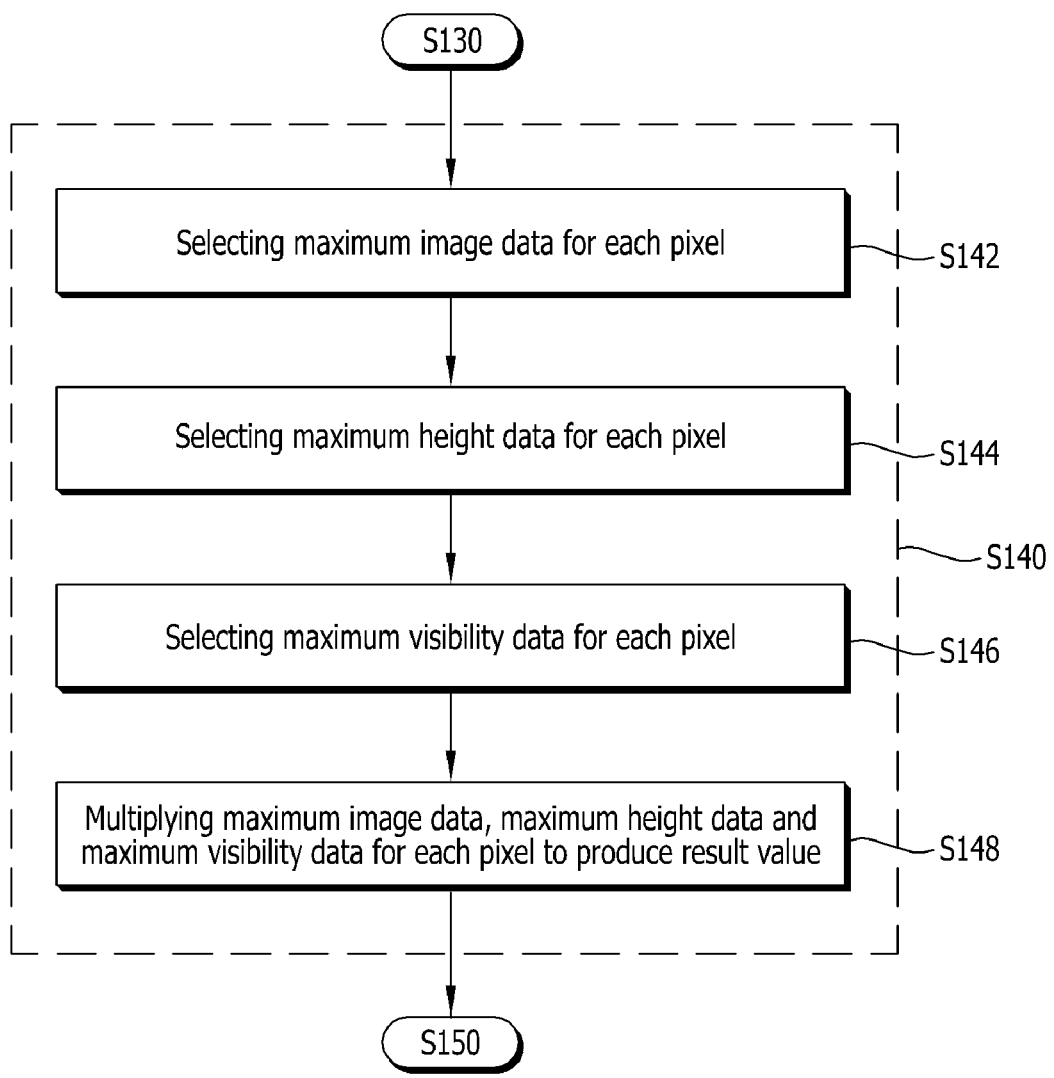
FIG. 4 is a flow chart illustrating an example of producing a result value by the terminal inspection method in FIG. 2.

FIG. 4 is a flow chart illustrating an example of producing a result value by the terminal inspection method in FIG. 2.

Referring to FIG. 4, in producing the result value, a maximum image data may be selected from the image data for the plurality of directions, for each pixel in step S142, a maximum height data may be selected from the height data for the plurality of directions, for each pixel in step S144, and a maximum visibility data may be selected from the visibility data for the plurality of directions, for each pixel in step S146. Then, the maximum image data, the maximum height data and the maximum visibility data, which are acquired for each pixel, may be multiplied to produce the result value in step S148.

In order to remove noise, the maximum image data, the maximum height data and the maximum visibility data may be selected after excluding a value greater than a predetermined reference value.

For example, average maximum image data may be selected from the M average image data, for each pixel, average maximum height data may be selected from the M average height data, for each pixel, and average maximum visibility data may be selected from the M average visibility data. Then, the image data, the height data and the visibility data acquired for each pixel are multiplied for each pixel to produce the result value.

In case that a maximum value for each data is used as described above, since the image data, the height data and the visibility data are greater in a terminal area than in a solder area, result value difference between the terminal area and the solder area may become greater by multiplication of the factors. Alternatively, average of each data may be used.

Thereafter, a terminal area and a solder area are discriminated from each other by using the produced result value in step S150.

Since the produced result value is determined by the image data, the height data and the visibility data, and the image data, the height data and the visibility data are generally greater in the terminal area than in the solder area, the result value difference between the terminal area and the solder area becomes greater by multiplication of the factors.

Specifically, in case an element having a reflectivity greater than surroundings, visibility is typically much greater than the surroundings. Thus, the terminal area has a greater result value than the solder area, thereby more emphasizing the terminal area.

Meanwhile, in order to discriminate the terminal area and the solder area from each other by using the produced result value, firstly, the result value produced for each pixel may be classified into at least two groups so that pixels belong to a same group are continuously distributed, and then the terminal area and the solder area may be discriminated from each other by using the classified group.

The terminal area and the solder area are classified into different areas from each other by the result value, and since the same area is located adjacent, the same area may be classified to be continuously distributed.

As described above, image data, height data and visibility data of a measurement target are acquired and multiplied to produce a result value, and a terminal area and a solder area are discriminated from each other by using the result value, to thereby more accurately determine the terminal area and more precisely inspect a terminal.

In addition, since the terminal area is determined by using three dimensional data based on height, it is not much affected by color of each area and not sensitive to light, in comparison with determining the terminal area by using two dimensional image. Thus, each area may be more accurately and easily discriminated, and noise of a camera may not have a great effect.

In addition, when the image data are acquired by using three dimensional data, the terminal area may be easily determined without acquiring two dimensional image data.

Figure 5:
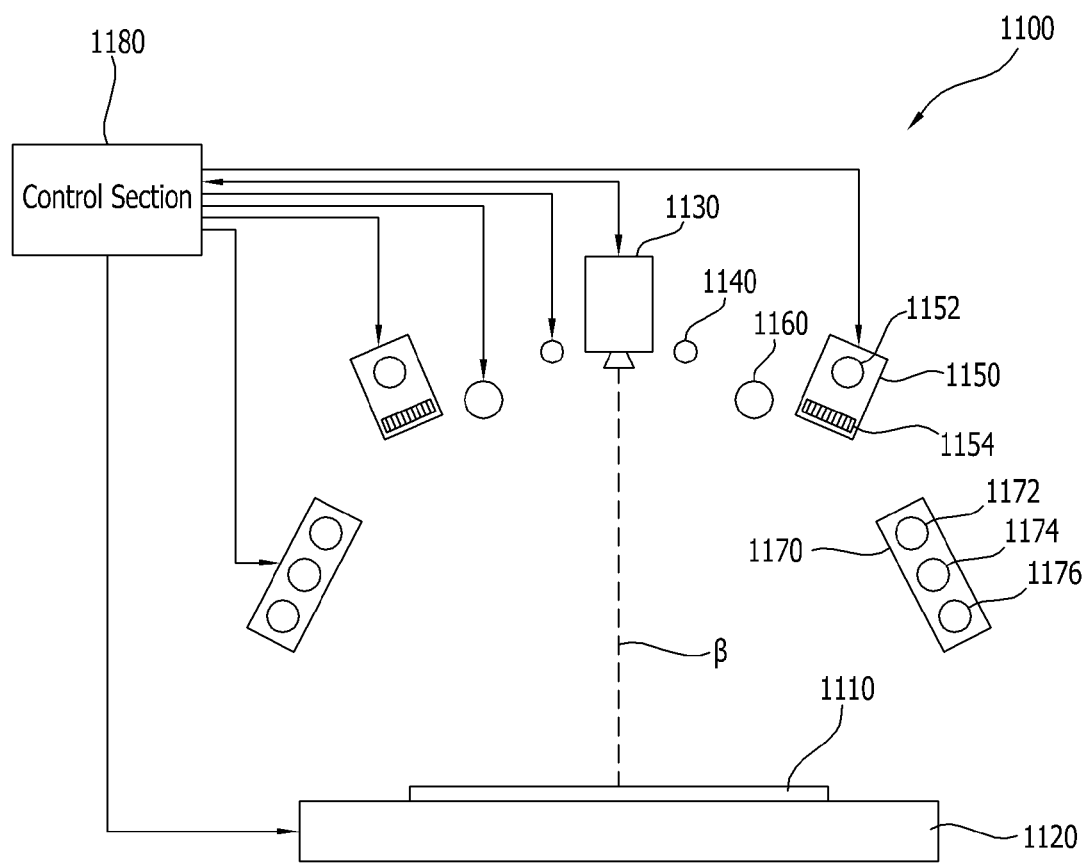
FIG. 5 is a schematic view illustrating a mounting board inspection apparatus according to an exemplary embodiment of the present invention.
Figure 6:
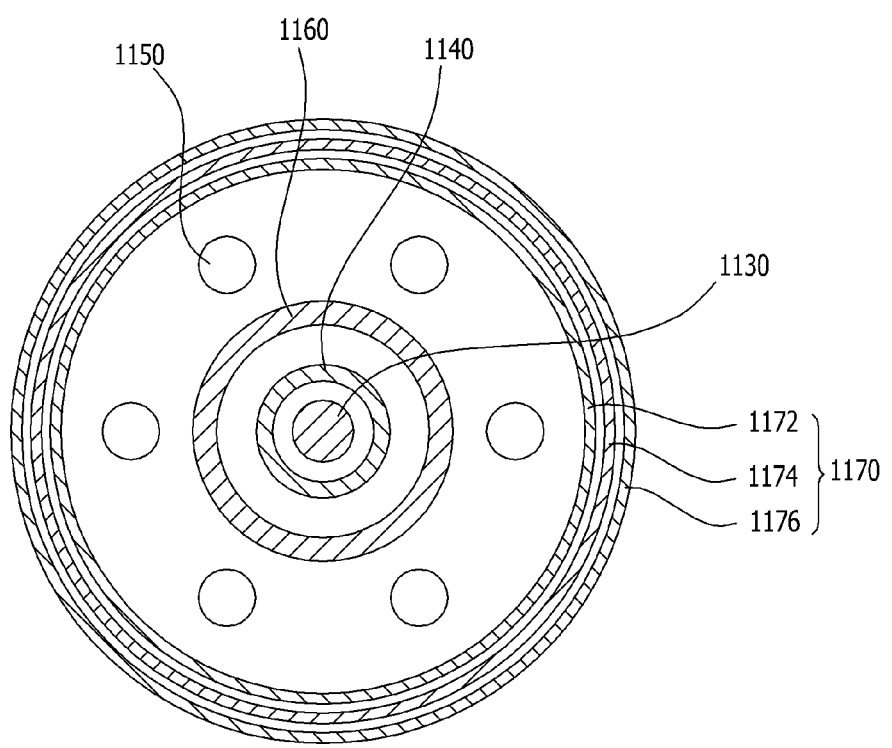
FIG. 6 is a plan view illustrating the mounting board inspection apparatus viewed from an upper side, which is illustrated in FIG. 5.
Figure 7:
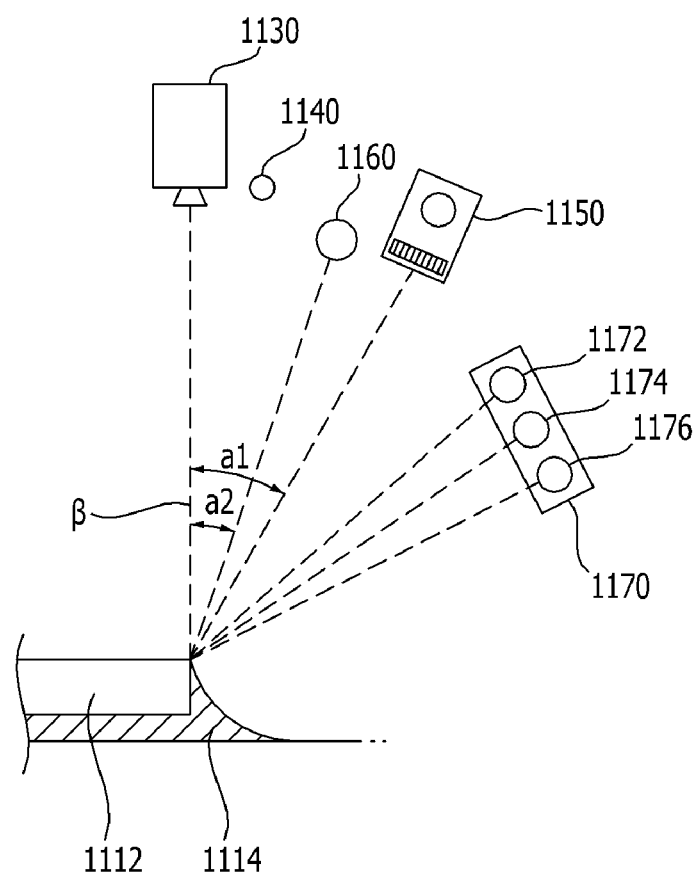
FIG. 7 is a schematic view illustrating a location relation between a projecting section and a second illumination section illustrated in FIG. 5.

FIG. 5 is a schematic view illustrating a mounting board inspection apparatus according to an exemplary embodiment of the present invention. FIG. 6 is a plan view illustrating the mounting board inspection apparatus viewed from an upper side, which is illustrated in FIG. 5. FIG. 7 is a schematic view illustrating a location relation between a projecting section and a second illumination section illustrated in FIG. 5.

Referring to FIGS. 5, 6 and 7, a mounting board inspection apparatus 1100 according to an exemplary embodiment of the present invention includes a stage 1120 transferring an inspection target 1110, an image photographing section 1130 photographing an image of the inspection target 1110, a first illumination section 1140 illuminating a light onto the inspection target 1110, a plurality of projecting sections 1150 each projecting a grating pattern light onto the inspection target 1110 and a second illumination section 1160 illuminating a light onto the inspection target 1110. In addition, the mounting board inspection apparatus 1100 may further include a third illumination section 1170 illuminating a light onto the inspection target 1110 and a control section 1180 controls the above elements.

The stage 1120 supports the inspection target 1110. The stage 1120 moves along an x-axis and a y-axis according to the control section 1180, and transfers the inspection target 1110 to a measurement location. The stage 1120 may move along a z-axis.

The image photographing section 1130 is disposed over the stage 1120 to photograph an image of the inspection target 1110. The image photographing section 1130 is installed over the stage 1120, in a direction substantially perpendicular to a reference surface of the stage 1120. The image photographing section 1130 may include a camera for photographing an image and an imaging lens. A reflection light reflected by the inspection target 1110 is imaged on a CCD camera or a CMOS camera by the imaging lens, and the camera receives the imaged reflection light and photographs an image. The image photographing section 1130 photographs an image of the inspection target 1110, for example, when the first illumination section 1140, the projecting section 1150 and the second illumination section 1160 respectively illuminate lights onto the inspection target 1110. In addition, the image photographing section 1130 photographs an image of the inspection target 1110, when the third illumination section 1170 illuminates a color light onto the inspection target 1110.

The first illumination section 1140 is disposed between the image photographing section 1130 and the projecting sections 1150, for example, adjacent to the image photographing section 1130. The first illumination section 1140 has a function of fiducial illumination to beginning-align the inspection target 1110 such as a printed circuit board having a semiconductor component formed thereon. The first illumination section 1140 is disposed adjacent to the image photographing section 1130, and thus illuminates the light in a direction substantially perpendicular to the inspection target 1110. The first illumination section 1140 is formed to have a ring shape surrounding the image photographing section 1130. For example, the first illumination section 1140 may have a structure in which many light emitting diodes (LEDs) are arranged in a circular ring form. The first illumination section 1140 may be formed in and integrally formed with the image photographing section 1130.

The plurality of projecting sections 1150 may be installed over the stage 1120 and inclined by a predetermined angle. Each of the projecting sections 1150 is for acquiring three dimensional shape information of the inspection target 1110, and generates the grating pattern light to project the generated grating pattern light onto the inspection target 1110. The projecting sections 1150 project the grating pattern lights onto the inspection target 1110 by a first angle a1. In other words, the projecting sections 1150 project the grating pattern lights by the first angle a1 inclined with respect to a normal line β perpendicular to a plane of the inspection target 1110. For example, first angle a1 is about 30°.

The projecting sections 1150 are disposed to project the grating pattern lights in various directions to increase inspection precision of the inspection target 1110. Thus, the projecting sections 1150 are spaced at a regular interval along a circumferential direction taking the image photographing section 1130 as a center. For example, the mounting board inspection apparatus 1100 includes six the projecting sections 1150 spaced by an angle of about 60°. Alternatively, the mounting board inspection apparatus 1100 may include various numbers of the projecting sections 1150 such as 2, 3, 4, 8, etc. The plurality of projecting sections 1150 projects the grating pattern lights onto the inspection target 1110 in different directions at a constant time interval.

Each projecting section 1150 may include a light source 1152 generating a light and a grating element 1154. The light generated by the light source 1152 passes the grating element 1154 and is converted into a grating pattern light. The grating element 1154 is transferred by using a grating transfer instrument such as a piezoelectric (PZT) actuator by $2\pi/n$ per one time and n times in total, so as to generate phase transited grating pattern light. The 'n' is a natural number greater than or equal to 2. The projecting section 1150 transfers the grating element 1154 by n times, and projects the grating pattern light onto the inspection target 1110 for each transfer. The projecting section 1150 may further include a projecting lens (not shown) focusing the grating pattern light passing through the grating element 1154 and projecting the grating pattern light onto the inspection target 1110.

The second illumination section 1160 is installed between the image photographing section 1130 and the projecting sections 1150, as shown in FIG. 6, and for example, installed between the first illumination section 1140 and the projecting sections 1150. In other words, the second illumination section 1160 is disposed at a space between the image photographing section 1130 and the projecting sections 1150, when the mounting board inspection apparatus 1100 is viewed from an upper side. The second illumination section 1160 is for setting an inspection area of the inspection target 1110, and especially, for clearly discriminating an area of a terminal 1112 and an area of a solder 1114 of the inspection target 1110 on which a semiconductor component is formed. Thus, contrast is required to be increased so as to clearly checking an end position of the terminal 1112 corresponding to a boundary area between the terminal 1112 and the solder 1114, and projection angle may preferably be designed to be nearby perpendicular to the inspection target 1110 so as to increase contrast. However, it is difficult to obtain desired contrast to just use the first illumination section 1140 illuminating at an angle nearby perpendicular to the inspection target 1110, and a whole brightness uniformity of a field of view (FOV) of a camera is reduced, so that the first illumination section 1140 is not proper to discriminate the end position of the terminal 1112. Accordingly, the second illumination section 1160 is additionally installed between the image photographing section 1130 and the projecting sections 1150 to increase contrast. The second illumination section 1160 illuminates the light at an angle smaller than that of the projecting section 1150 with respect to the normal line β perpendicular to the plane of the inspection target 1110. In other words, the second illumination section 1160 illuminates the light at a second angle a2 smaller than the first angle a1, which is the illumination angle of the projecting section 1150, with respect to the normal line β perpendicular to the plane of the inspection target 1110. Although it is better as the illumination angle of the second illumination section 1160 becomes nearby perpendicular, the illumination angle of the second illumination section 1160 is determined by considering a structural feature of the inspection apparatus and contrast increase. As a result of an experiment, when the second illumination section 1160 illuminates at an angle ranging from about 17° to about 20°, it is confirmed that contrast is increased without the problem of the brightness uniformity. The second illumination section 1160 is formed to have a ring form surrounding the image photographing section 1130. For example, the second illumination section 1160 may be formed to have a structure in which many LEDs are arranged in a ring form.

As described above, the second illumination section 1160 of the ring form, which is independent of the first illumination section 1140, is additionally installed between the image photographing section 1130 and the projecting sections 1150, and the second illumination section 1160 illuminates the light onto the inspection target 1110 at an illumination angle that is more nearby perpendicular than the illumination angle of the projecting section 1150, thereby increasing the contrast and the brightness uniformity, and clearly discriminating the area of the terminal 1112 and the area of the solder 1114 formed on the inspection target 1110.

Meanwhile, the mounting board inspection apparatus 1100 may further include the third illumination section 1170 installed adjacent to the inspection target 1110. The third illumination section 1170 is for setting an inspection area of the inspection target 1110 or for a local fiducial, and generates a color light to illuminate the generated color light onto the inspection target 1110. The third illumination section 1170 may include a first color illumination section 1172, a second color illumination section 1174 and a third color illumination section 1176 generating lights each having different color. For example, the first color illumination section 1172 generates a red light, the second color illumination section 1174 generates a green light, and the third color illumination section 1176 generates a blue light. The colors generated by the first, second and third color illumination sections 1172, 1174 and 1176 may be variously changed.

Each of the first, second and third color illumination sections 1172, 1174 and 1176 has a ring form. Diameters forming the ring forms of the first, second and third color illumination sections 1172, 1174 and 1176 become greater, from the first color illumination section 1172 to the third color illumination section 1176. Thus, the second color illumination section 1174 illuminates the color light at a greater illumination angle in comparison with the first color illumination section 1172, the third color illumination section 1176 illuminates the color light at a greater illumination angle in comparison with the second color illumination section 1174.

The control section 1180 wholly controls the above described elements. Particularly, the control section 1180 controls the transfer of the stage 1120 to locate the inspection target 1110 to the inspection location. The control section 1180 sequentially operates the plurality of projecting sections 1150, and controls the projecting section 1150 to illuminate the grating pattern light onto the inspection target 1110 for each transfer while transferring the grating element 1154 of each projecting section 1150. The control section 1180 controls the first illumination section 1140 and the second illumination section 1160 to illuminate the light for aligning the inspection target 1110, setting an area, etc. and controls the third illumination section 1170 to illuminate color light. The control section 1180 controls the image photographing section 1130 to photograph an image of the inspection target 1110 when the first illumination section 1140, the second illumination section 1160, the projecting section 1150, the third illumination section 1170, etc. illuminate lights. The control section 1180 discriminates the area of the terminal 1112 of the inspection target 1110 and the area of the solder 1114 by using a first image of the inspection target 1110 photographed through illumination of the second illumination section 1160 and a second image of the inspection target 1110 photographed through projection of the grating pattern light of the projecting sections 1150.

Figure 8:
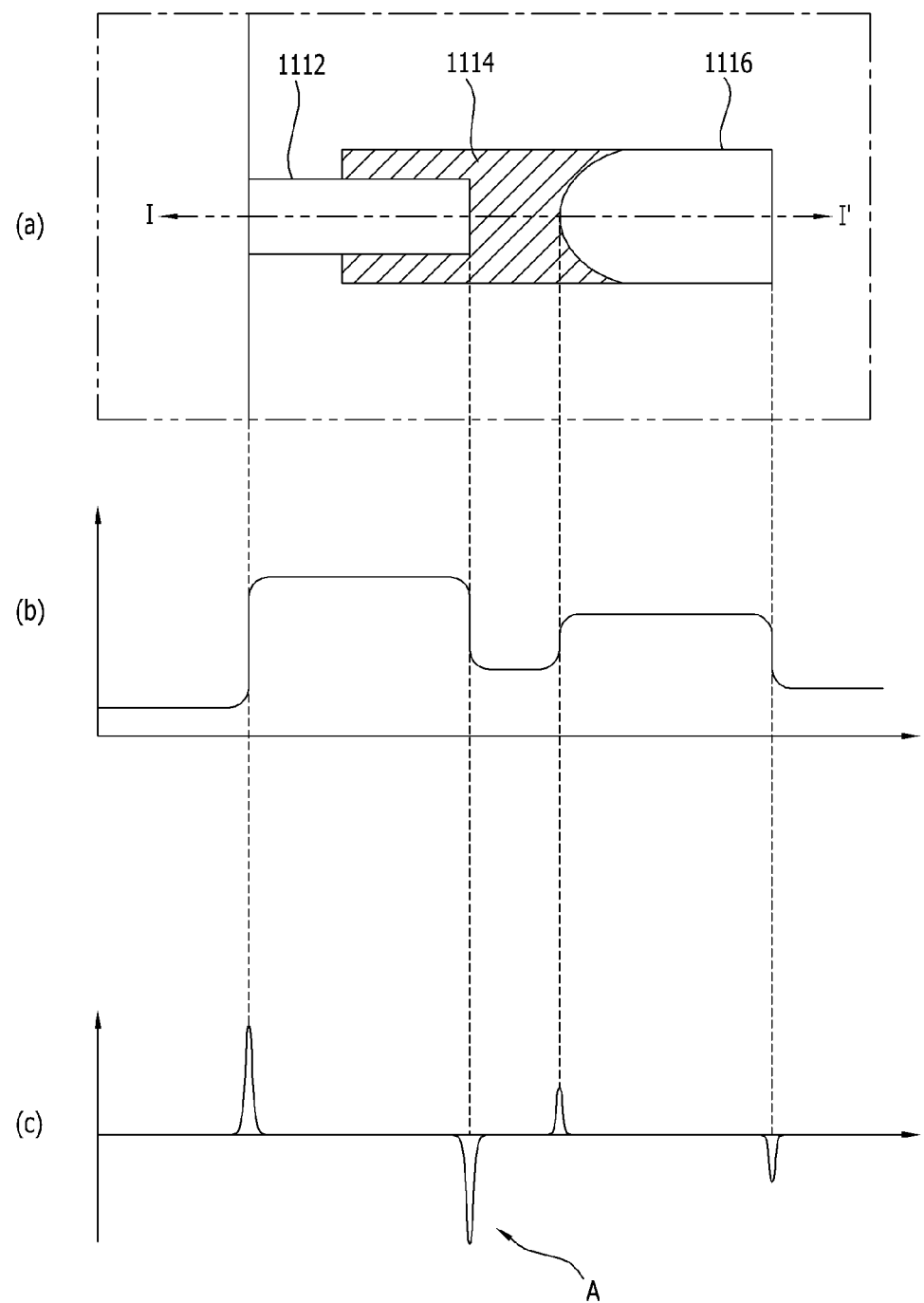
FIG. 8 is a plan view illustrating a process of discriminating a terminal area and a solder area of an inspection target.

FIG. 8 is a plan view illustrating a process of discriminating a terminal area and a solder area of an inspection target. In FIG. 8, (a) represents a contrast map of a status that the terminal 1112 of the semiconductor component is mounted on a board pad 1116 by the solder 1114, (b) represents contrast information obtained by projecting the contrast map shown in (a) along a line of I-I', and (c) represents differentiation information by differentiate the contrast information shown in (b).

Referring to FIGS. 5 and 8, the control section 1180 acquires image data from the first image photographed by illumination of the second illumination section 1160. In addition, the control section 1180 acquires three dimensional data such as visibility data, height data, etc. from the second image photographed by the grating pattern light of the projecting sections 1150. For example, the height data may be acquired by converting the second image using a bucket algorithm, and the visibility data may be acquired by converting the second image using a visibility calculation algorithm.

The control section 1180 combines at least one of the visibility data and the height data acquired from the second image and the image data acquired from the first image to generate new contrast map as illustrated in (a) of FIG. 8. For example, the contrast map may be generated by multiplying the image data and the height data for each pixel, multiplying the image data and the visibility data for each pixel, or multiplying the image data, the height data and the visibility data for each pixel.

In case of using the plurality of projecting sections 1150, the height data and the visibility data acquired for each pixel may be plural data measured in the plurality of directions. Thus, the plural data may be properly used to generate the effective contrast map. For example, in generating the contrast map, a maximum height data may be selected from the height data for the plurality of directions, for each pixel, and a maximum visibility data may be selected from the visibility data for the plurality of directions, for each pixel. Then, at least one of the maximum height data and the maximum visibility data, which are acquired for each pixel, and the image data may be multiplied to generate the contrast map. In order to remove noise, the maximum height data and the maximum visibility data may be selected after excluding a value greater than a predetermined reference value.

In case that a maximum value for each data is used as described above, since the image data, the height data and the visibility data are greater in the area of the terminal 1112 than the area of the solder 1114, difference in the contrast map between the area of the terminal 1112 and the area of the solder 1114 may become greater by multiplication of the factors. Alternatively, in generating the contrast map, average of each data may be used instead of using maximum of each data.

Since the contrast map is determined by the image data, the height data and the visibility data, and the image data, the height data and the visibility data are generally greater in the area of the terminal 1112 than the area of the solder 1114, the difference between the area of the terminal 1112 and the area of the solder 1114 becomes greater by multiplication of the factors. Specifically, in case an element having a reflectivity greater than surroundings, visibility is typically much greater than the surroundings. Thus, the area of the terminal 1112 has a greater result value than the area of the solder 1114, thereby more emphasizing the area of the terminal 1112.

Thereafter, the control section 1180 discriminates the terminal 1112 and the area of the solder 1114, which are formed on the inspection target 1110, from each other by analyzing the generated contrast map. In other words, the control section 1180 generates contrast information shown in (b) of FIG. 8 by projecting the contrast map shown in (a) of FIG. 8 along a line of I-I'. Then, the control section 1180 differentiates the contrast information shown in (b) of FIG. 8 to generate differentiation information shown in (c) of FIG. 8. When there goes from the area of the terminal 1112 to the area of the solder 1114, contrast is greatly reduced. Thus, the control section 1180 detects a position 'A' having a maximum value as a negative value from the generated differentiation information, and determines the position 'A' as a location at which the area of the terminal 1112 and the area of the solder 1114 meet, thereby discriminating the area of the terminal 1112 and the area of the solder 1114 from each other.

As described above, the contrast map, which is generated by combining the image data and at least one of the height data and the visibility data, contrasts of which are increased by the second illumination section 1160, is used, to thereby clearly discriminate the area of the terminal 1112 and the area of the solder 1114 from each other.

Figure 9:
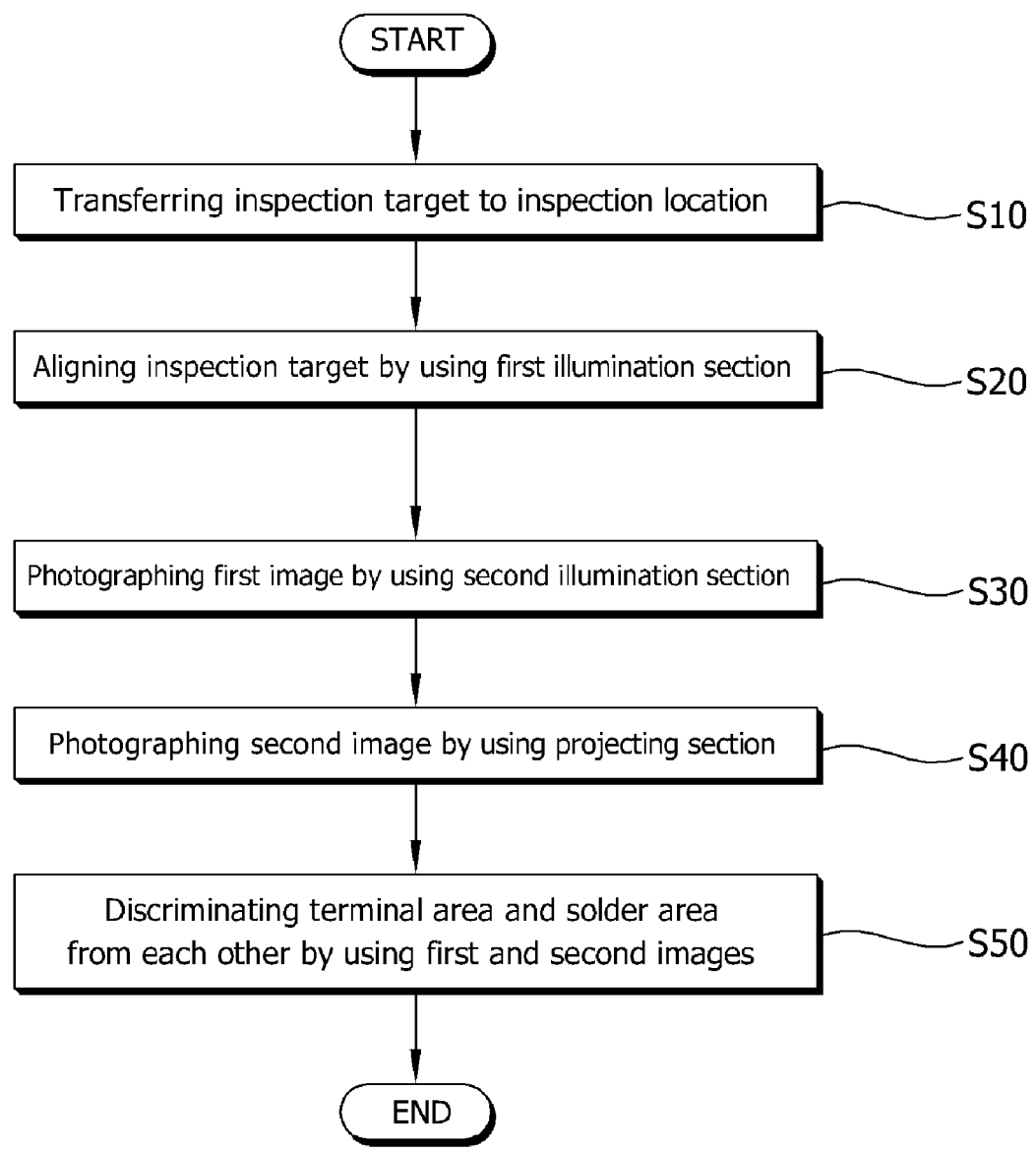
FIG. 9 is a flow chart illustrating a mounting board inspection method according to an exemplary embodiment of the present invention.

FIG. 9 is a flow chart illustrating a mounting board inspection method according to an exemplary embodiment of the present invention.

Referring to FIGS. 5 and 9, in order to inspect the inspection target 1110, the control section 1180 transfers the stage 1120, so that the inspection target 1110 is transferred to a measurement location in step S10.

After transferring the inspection target 1110 to the measurement location, the first illumination section 1140 installed adjacent to the image photographing section 1130 illuminates a light onto the inspection target 1110, and the inspection target 1110 is aligned in step S20. In other word, an image of the inspection target 1110 is photographed in the image photographing section 1130 by using the light illuminated from the first illumination section 1140, and after checking the image including an align mark, etc., an inspection location of the inspection target 1110 is accurately aligned by precisely transferring the stage 1120.

After completing the alignment of the inspection target 1110, a first image of the inspection target 1110 is photographed by using the second illumination section 1160 in step S30. Particularly, the second illumination section 1160, which is installed between the image photographing section 1130 and the projecting sections 1150, are operated to illuminate a light at an angle of about 17° to 20° smaller than that of the projecting section 1150 with respect to the inspection target 1110. After illuminating the light onto the inspection target 1110 by the second illumination section 1160, the first image of the inspection target 1110 is photographed in the image photographing section 1130.

Independent of photographing the first image, a second image of the inspection target 1110 is photographed by using the projecting sections 1150 in step S40. Particularly, the plurality of projecting sections 1150, which is spaced apart along a circumferential direction taking the image photographing section 1130 as a center, are sequentially operated to sequentially project grating pattern lights onto the inspection target 1110 at an angle of about 30°. Each of the projecting sections 1150 projects the grating pattern light onto the inspection target 1110 for each transfer while transferring the grating element 1154. After projecting the grating pattern light onto the inspection target 1110, the second image of the inspection target 1110 is photographed in the image photographing section 1130.

Thereafter, the area of the terminal 1112 and the area of the solder 1114 of the inspection target 1110 are discriminated from each other by using the first image and the second image photographed in the image photographing section 1130 in step S50. Particularly, the control section 1180 combines at least one of the visibility data and the height data acquired from the second image, and the image data acquired from the first image to generate a contrast map. Then, the control section 1180 discriminates the area of the terminal 1112 and the area of the solder 1114, which are formed on the inspection target 1110, from each other by analyzing the generated contrast map. In other words, the control section 1180 generates contrast information showing contrast changes according to positions with projecting the contrast map in one direction, and differentiates the contrast information to generate differentiation information for showing a position at which contrast change greatly occurs. Thereafter, the control section 1180 detects a position having a maximum value as a negative value from the generated differentiation information, and determines the position as a location at which the area of the terminal 1112 and the area of the solder 1114 meet, thereby discriminating the area of the terminal 1112 and the area of the solder 1114 from each other.

Independently of photographing the second image using the projecting section 1150 and photographing the first image using the second illumination section 1160, an independent image may be photographed by using the third illumination section 1170. Particularly, the third illumination section 1170 installed adjacent to the stage 1120 is operated to illuminate a color light onto the inspection target 1110. The third illumination section 1170 may include the first color illumination section 1172, the second color illumination section 1174 and the third color illumination section 1176, which are formed in a multi-stepped ring form, and generate different color lights. The first color illumination section 1172, the second color illumination section 1174 and the third color illumination section 1176 simultaneously or sequentially illuminate the color lights. After illuminating the color lights onto the inspection target 1110 by using the third illumination section 1170, a color image of the inspection target 1110 is photographed in the image photographing section 1130. The control section 1180 uses the color image, which is photographed in the image photographing section 1130, as information for setting an inspection area of the inspection target 1110 or for a local fiducial, and the color image is combined with the second image to be used as information for precisely inspecting a three dimensional shape of the inspection target 1110.

As described above, the mounting board inspection apparatus 1100 according to the present invention includes the second illumination section 1160 of a ring form, which is installed between the image photographing section 1130 and the projecting sections 1150, independently of the first illumination section 1140 installed adjacent to the image photographing section 1130, and the second illumination section 1160 illuminates a light onto the inspection target 1110 at an angle of about 17° to 20° smaller than that of the projecting section 1150. Thus, the brightness uniformity in a field of view may be enhanced by forming the second illumination section 1160 in a ring structure, and an image, which is photographed with setting an illumination angle of the second illumination section 1160 to be more nearby perpendicular than that of the projecting section 1150, may have an increased contrast, to thereby clearly discriminate the area of the terminal 1112 and the area of the solder 1114 from each other, which are formed on the inspection target 1110, and enhance inspection reliability.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of determining a terminal area for inspecting a printed circuit board (PCB) comprising:
   photographing a measurement target to acquire image data for each pixel of the measurement target formed on the PCB by an image photographing section;
   acquiring height data for each pixel of the measurement target by a control section;
   acquiring visibility data for each pixel of the measurement target by the control section;
   multiplying the acquired image data by the height data and the visibility data for each pixel to produce a result value emphasizing a terminal area over an adjacent area by the control section; and
   discriminating the terminal area from the adjacent area by using the produced result value in which the terminal area is emphasized over the adjacent area by the control section.

2. The method of claim 1, wherein acquiring the height data and the visibility data for each pixel of the measurement target, includes:
   projecting a grating pattern light onto the measurement target by N times by a projecting section;
   acquiring reflection image data by the grating pattern light projected onto the measurement target by N times by the image photographing section;
   acquiring the height data by using the acquired N reflection image data by the control section; and
   acquiring the visibility data by using the reflection image data by the control section.

3. The method of claim 2, after acquiring the reflection image data by the grating pattern light projected onto the measurement target by N times,
   further comprising averaging the N reflection image data to acquire the image data by the control section.

4. The method of claim 2, wherein the measurement target is photographed in a plurality of directions, and image data for each pixel, the height data for each pixel and the visibility data for each pixel of the measurement target are acquired for the plurality of directions, and
   wherein multiplying the acquired image data by at least one of the height data and the visibility data for each pixel to produce the result value includes:
   selecting maximum image data from the image data for the plurality of directions, for each pixel by the control section;
   selecting maximum height data from the height data for the plurality of directions, for each pixel by the control section;
   selecting maximum visibility data from the visibility data for the plurality of directions, for each pixel by the control section; and
   multiplying the maximum image data, the maximum height data and the maximum visibility data, which are selected for each pixel, to produce the result value by the control section.

5. The method of claim 4, wherein multiplying the acquired image data by at least one of the height data and the visibility data for each pixel to produce the result value further includes checking whether the maximum image data, the maximum height data and the maximum visibility data are greater than a predetermined reference value or not by the control section.

6. The method of claim 1, wherein photographing a measurement target to acquire image data for each pixel of the measurement target is performed by illuminating a grating pattern light onto a measurement target by N times for each of a plurality of M directions to acquire M×N image data, and M height data and M visibility data for each pixel of the measurement target are acquired, wherein N and M are natural numbers greater than or equal to two, multiplying the acquired image data by at least one of the height data and the visibility data for each pixel to produce a result value, comprising:

averaging the N image data among the M×N image data for each of the M directions, to produce M average image data corresponding to the M directions for each pixel by the control section;

selecting average maximum image data from the M average image data, for each pixel by the control section;

selecting maximum height data from the M height data, for each pixel by the control section;

selecting maximum visibility data from the M visibility data, for each pixel by the control section; and multiplying the average maximum image data, the maximum height data and the maximum visibility data for each pixel, which are selected for each pixel, to produce a result value by the control section.

7. The method of claim 6, wherein discriminating the terminal area by using the produced result value includes:

classifying the result value produced for each pixel into at least two groups so that pixels belong to a same group are continuously distributed by the control section; and discriminating the terminal area from a solder area by using the classified group by the control section.

8. The inspection method of claim 2, wherein in acquiring the visibility data by using the reflection image data, the visibility data are acquired by dividing amplitude by average in intensity of the N reflection image data.

\* \* \* \* \*